United States Patent

[11] 3,585,525

[72] Inventors Eldred H. Wiechmann; Charles A. Harmon; James J. Gotshall, all of Kokomo, Ind.

[21] Appl. No. 800,344
[22] Filed Feb. 7, 1969
[45] Patented June 15, 1971
[73] Assignee General Motors Corporation Detroit, Mich.

[54] VARIABLE FREQUENCY SIGNAL GENERATOR
4 Claims, 1 Drawing Fig.

[52] U.S. Cl. .................... 331/117, 331/173, 331/178
[51] Int. Cl. .................... H03b 5/12
[50] Field of Search .................... 331/117, 178; 332/16 T

[56] References Cited

UNITED STATES PATENTS

| | | | |
|---|---|---|---|
| 2,972,120 | 2/1961 | Kircher et al. | 332/16 |
| 3,108,234 | 10/1963 | Burns | 331/117 |
| 3,257,623 | 6/1966 | See | 331/178 |
| 3,319,179 | 5/1967 | Hepner | 331/117 |
| 3,375,462 | 3/1968 | McTaggart | 331/117 |

*Primary Examiner*—John Kominski
*Attorneys*—C. R. Meland, E. W. Christen and Tim G. Jagodzinski

ABSTRACT: An oscillator produces an output signal at the frequency of the oscillator when operative. The oscillator includes a biasing circuit for determining the operability of the oscillator and a tuning circuit for determining the frequency of the oscillator. A transistor is connected in the biasing circuit and in the tuning circuit for defining the operability and the frequency of the oscillator as functions of the voltage applied to the transistor. A control circuit regulates the voltage applied to the transistor so as to control the production and the frequency of the output signal.

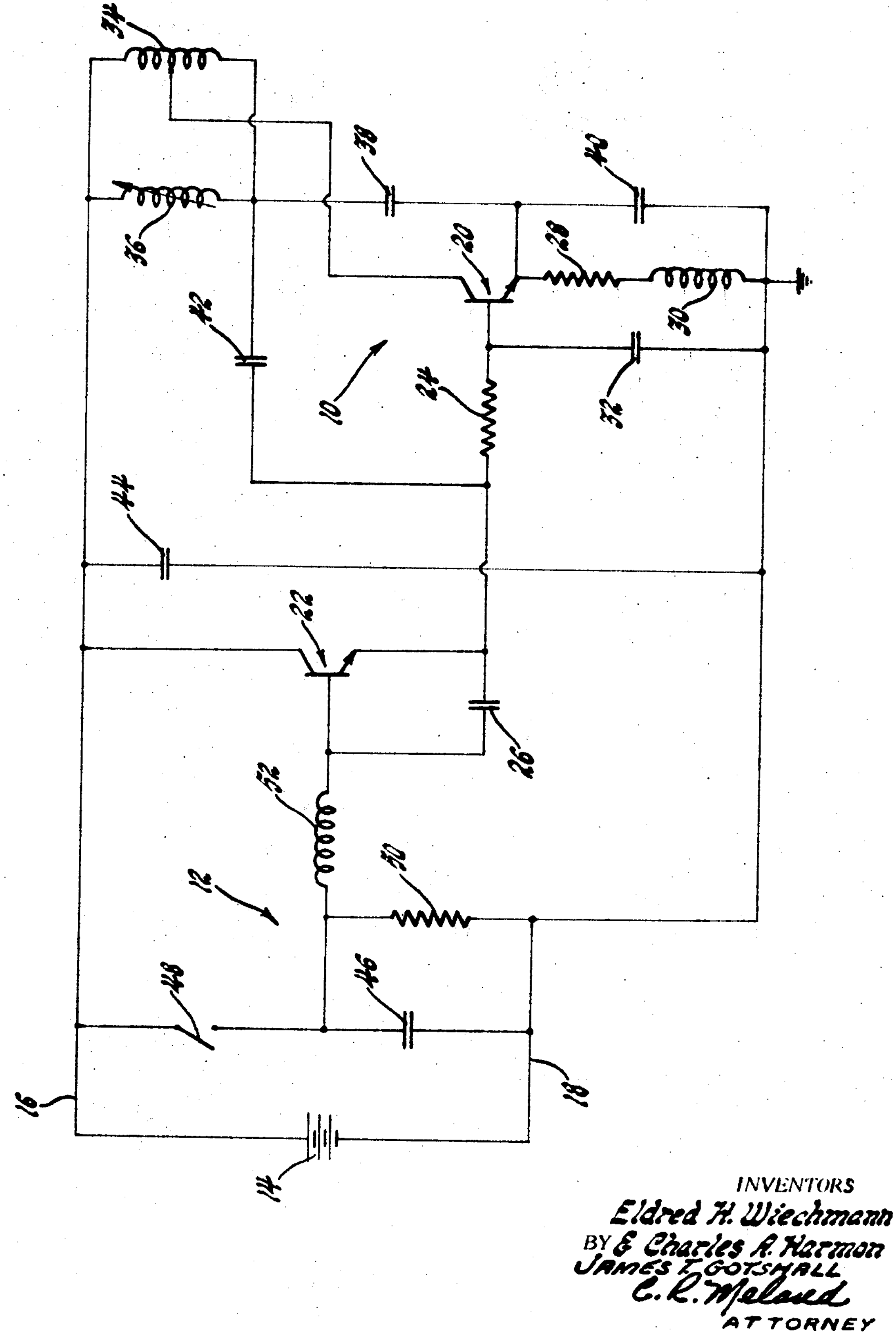
INVENTORS
Eldred H. Wiechmann
BY E. Charles A. Harmon
JAMES T. GOTSHALL
C. R. Meland
ATTORNEY

VARIABLE FREQUENCY SIGNAL GENERATOR

This invention relates to a frequency modulator, and more particularly to a variable frequency signal generator.

Ordinarily, a variable frequency signal generator includes an oscillator for providing an output signal at the frequency of the oscillator when operative. The oscillator includes a biasing circuit for determining the operability of the oscillator and a tuning circuit for determining the frequency of the oscillator. A control circuit is connected to the biasing circuit and the tuning circuit of the oscillator for controlling the production and the frequency of the output signal.

Variable frequency signal generators are adaptable to a wide variety of electrical applications. Thus, a variable frequency signal generator may be utilized as a reference signal source in the testing and calibrating of frequency responsive equipment. Alternately, a variable frequency signal generator may be employed as a radiofrequency transmitter for remotely controlling frequency sensitive apparatus. The present invention proposes a variable frequency signal generator which is primarily, but not exclusively, intended for the latter application.

According to one aspect of the invention, a variable frequency signal generator is provided wherein the operability and the frequency of the oscillator are regulated by a single control transistor. In general, this is accomplished by connecting the control transistor in the biasing circuit and in the tuning circuit of the oscillator so as to define the operability and the frequency of the oscillator as functions of the conductivity and the impedance of the transistor which are determined by the voltage applied to the transistor.

In another aspect of this invention, a variable frequency generator is provided wherein the frequency of the oscillator is varied by modifying the effect of a tuning capacitor in the tuning circuit. Generally, this is accomplished by connecting the control transistor in series with the tuning capacitor across the tuning circuit so that the capacitance across the tuning circuit is altered as a function of the voltage applied to the transistor thereby to correspondingly vary the frequency of the oscillator.

In a further aspect of the invention, a variable frequency signal generator is provided wherein the oscillator is rendered operative to produce an output signal for a determinate period during which the frequency of the oscillator is varied so as to sweep the frequency of the output signal. In general, this is accomplished by connecting a control capacitor to the control transistor for applying the voltage on the capacitor to the transistor. Further a manually operable switch is connected to the control capacitor for selectively charging and discharging the capacitor thereby to appropriately vary the voltage applied to the transistor so as to produce the desired output signal.

These and other aspects of the invention will become more apparent by reference to the following detailed description of a preferred embodiment when considered in conjunction with the accompanying drawing which is a schematic diagram of a variable frequency signal generator incorporating the principles of the invention.

Referring to the drawing, a variable frequency signal generator is disclosed for utilization as a radiofrequency signal transmitter. The illustrated radiofrequency signal transmitter includes an oscillator 10 for providing a radiofrequency output signal and a control circuit 12 connected with the oscillator 10 for regulating the operability and the frequency of the oscillator 10 so as to control the production and the frequency of the radiofrequency output signal.

A source of direct current voltage 14 is connected between a pair of power supply lines 16 and 18. The power supply line 18 is grounded. The DC voltage source 14 may be conveniently provided by a battery or any other suitable direct current voltage source. The principal active elements of the oscillator 10 are an amplifying transistor 20 and a control transistor 22 each having base, emitter and collector electrodes. Although the junction transistors 20 and 22 are illustrated as being of the NPN type, it is to be understood that they may also be of the PNP type.

A biasing circuit is included within the oscillator 10 for determining the operability of the oscillator 10. The biasing circuit includes the control transistor 22 and a biasing resistor 24 connected between the emitter electrode of the control transistor 22 and the base electrode of the amplifying transistor 20. The collector electrode of the control transistor 22 is connected directly to the power supply line 16. A bypass capacitor 26 is connected between the base and emitter electrodes of the control transistor 22. Further, the oscillator biasing circuit includes a biasing resistor 28 connected in series with a radiofrequency choke coil 30 between the emitter electrode of the amplifying transistor 20 and the power supply line 18. A radio frequency bypass capacitor 32 is connected between the base electrode of the amplifying transistor 20 and the power supply line 18.

A tuning circuit is included within the oscillator 10 for determining the frequency of the oscillator 10. The turning circuit includes the parallel combination of a fixed tuning coil 34 and a variable tuning coil 36 connected in series with a first tuning capacitor 38 between the power supply line 16 and the emitter electrode of the amplifying transistor 20. The collector electrode of the amplifying transistor 20 is connected to the center tap of the fixed tuning coil 34. Further, the oscillator tuning circuit includes a second tuning capacitor 40 connected between the emitter electrode of the ampliyfing transistor 20 and the power supply line 18. The oscillator tuning circuit also includes the control transistor 22 connected in series with a third tuning capacitor 42 from the power supply line 16 to the junction between the tuning coils 34 and 36 and the first tuning capacitor 38. A radiofrequency bypass capacitor 44 is connected from the power supply line 16 to the power supply line 18.

The control circuit 12 includes a control capacitor 46 connected in series with a normally open, manually operable switch 48 between the power supply lines 16 and 18. A discharge resistor 50 is connected from the junction between the capacitor 46 and the switch 48 to the power supply line 18. The base or control electrode of the control transistor 22 is connected through a radiofrequency choke coil 52 to the junction between the capacitor 46, the switch 48 and the resistor 50.

It will now be readily apparent that the oscillator 10 is a modified Collpitt's type oscillator. The biasing circuit comprising the control transistor 22 and the biasing resistors 24 and 28 establishes a DC bias signal which determines the operability of the oscillator 10. The tuning circuit comprising the control transistor 22, the tuning coils 34 and 36, and the tuning capacitors 38, 40 and 42 defines an AC resonant signal which determines the frequency of the oscillator 10. In the illustrated radiofrequency signal transmitter, the AC resonant signal is a radiofrequency output signal. The fixed tuning coil 34 provides an antenna for radiating the radiofrequency output signal. The variable tuning coil 36 provides a vernier for fine turning the frequency of the radiofrequency output signal.

The control transistor 22 is connected in the biasing circuit for regulating the operability of the oscillator as a function of the voltage applied to the base or control electrode. The oscillator 10 is turned on and rendered operative to initiate a radiofrequency output signal when the amplifying transistor 20 is conductive. Conversely, the oscillator is turned off and rendered inoperative to terminate the radiofrequency output signal when the amplifying transistor 20 is nonconductive. The DC bias signal established in the biasing circuit is applied across the base-emitter junction of the amplifying transistor 20. The amplifying transistor 22 is rendered conductive when the DC bias signal is at and above a threshold voltage and is rendered nonconductive when the DC bias signal is below the threshold voltage. The threshold voltage of the amplifying transistor 20 is defined as a particular portion of the voltage across the emitter and collector electrodes of the transistor 20.

In the biasing circuit, the control transistor 22 provides a DC biasing circuit impedance. The DC impedance of the control transistor 22 primarily comprises the series connection of the collector electrode resistance and the emitter electrode resistance. The DC bias signal applied to the amplifying transistor 20 is an inverse function of the DC impedance of the control transistor 22. Thus, when the DC bias signal is at a threshold voltage, the DC impedance of the control transistor 22 is similarly at a threshold impedance. Since the DC impedance of the control transistor 22 is inversely related to the voltage applied to the base electrode, the operability of the oscillator 10 is defined as a function of the voltage applied to the base electrode of the control transistor 22.

The control transistor 22 is connected in the tuning circuit for regulating the frequency of the oscillator 10 as a function of the voltage applied to the base or control electrode. The frequency of the AC resonant signal in the tuning circuit is an inverse function of the capacitors across the tuning circuit. The frequency of the oscillator 10 is the same as the frequency of the AC resonant signal. As previously described, in the illustrated radiofrequency signal transmitter the AC resonant signal is a radiofrequency output signal. At the radiofrequency of the AC resonant signal, the bypass capacitor 32 effectively connects the base electrode of the amplifying transistor 20 to the power supply line 18 and the bypass capacitor 44 effectively connects the voltage line 16 to the power supply 18. The choke coil 30 prohibits the radiofrequency signal from passing through the biasing resistor 28 thereby to prevent the radiofrequency signal from influencing the DC bias signal applied to the amplifying transistor 20.

In the tuning circuit, the control transistor 22 provides an AC tuning circuit impedance. The AC impedance of the control transistor 22 primarily comprises the series connection of the parallel combination of the collector electrode resistance and capacitance and the parallel combination of the emitter electrode resistance and capacitance. The control transistor 22 is connected in series with the tuning capacitor 42 across the tuning circuit. Thus, as the AC impedance of the control transistor 22 increases, the effective capacitance of the capacitor 42 across the tuning circuit decreases thereby to decrease the total capacitance across the tuning circuit so as to increase the frequency of the AC resonant signal. Hence, the frequency of the oscillator 10 is an inverse function of the AC impedance of the control transistor 22. Since the AC impedance of the control transistor 22 is inversely related to the voltage applied to the base electrode, the frequency of the oscillator 10 is a direct function of the voltage applied to the base electrode of the control transistor 22.

In operation, when the manually operable switch 48 is closed, the control capacitor 46 quickly charges to the potential of the voltage source 14. The voltage on the capacitor 46 is coupled through the choke coil 52 to the base electrode of the control transistor 22. The resulting increase in the voltage applied to the base electrode of the control transistor 22 renders it conductive in saturation. In saturation, the DC impedance of the control transistor 22 is very low. This low DC impedance of the control transistor 22 increases the DC bias signal in the biasing circuit above the threshold voltage of the amplifying transistor 20 thereby to turn on the oscillator 10 and render it operative to initiate a radiofrequency output signal.

When the manually operable switch 48 is opened, the control capacitor 46 discharges partially through the resistor 50 and partially through the choke coil 52 and the base-emitter junction of the control transistor 22. As the capacitor 46 gradually discharges, the voltage applied to the base electrode of the control transistor 22 decreases thereby to decrease the conductivity and increase the DC impedance and the AC impedance of the transistor 22. The resulting increase in the AC impedance of the control transistor 22 decreases the effective capacitance of the tuning capacitor 42 across the tuning circuit thereby to increase the frequency of the radiofrequency output signal. Eventually, the decrease in the voltage applied to the base electrode of the control transistor 22 renders it nonconductive in cutoff. In cutoff, the DC impedance of the control transistor 22 is very high. This high DC impedance of the control transistor 22 decreases the DC bias signal in the biasing circuit below the threshold voltage of the amplifying transistor 20 thereby to turn off the oscillator 10 and render it inoperative to terminate the radiofrequency signal.

It will now be appreciated that when the manually operable switch 50 is momentarily closed, the oscillator 10 produces a radiofrequency output signal for a determinate period during which the frequency of the radiofrequency output signal gradually increases or sweeps over a frequency range. Hence, the oscillator 10 is of the type commonly known as a "chirp" or "burst" transmitter. The duration of the radiofrequency output signal is directly related to the voltage discharge characteristic of the capacitor 46 and the frequency of the radiofrequency output signal is inversely related to the voltage discharge characteristic of the capacitor 46.

The bypass capacitor 26 smooths the frequency sweep of the radiofrequency output signal by equalizing the potential between the base and emitter electrodes of the control transistor 22 at the frequency of the radiofrequency signal. This prohibits the radiofrequency signal from passing through the base-emitter junction of the control transistor 22 thereby to prevent the radiofrequency signal from distorting the voltage discharge characteristic of the capacitor 46. The choke coil 52 blocks the radiofrequency signal at the base electrode of the control transistor 22 so as to magnify the effect of variations in the AC impedance of the control transistor 22 thereby to produce a greater frequency sweep range.

It is to be understood that the preferred embodiment of the invention disclosed herein is illustrated for demonstration purposes only and that various alterations and modifications may be made thereto. Thus, the oscillator 10 need not be a modified Collpitt's type oscillator but may be any suitable oscillator. Similarly, the control circuit 12 need not take the form of a capacitor discharge circuit but may take the form of any desired voltage control circuit. Further, the control transistor 22 need not be a junction transistor but may be a field effect transistor or any other suitable transistor.

What we claim is:

1. A variable frequency signal generator, comprising: oscillator means for providing an output signal at the frequency of the oscillator means when operative; biasing circuit means forming a part of the oscillator means for rendering the oscillator means operative; tuning circuit means forming a part of the oscillator means for determining the frequency of the oscillator means when operative; a transistor forming at least a part of the biasing circuit means for rendering the oscillator means operative when the transistor is conductive and forming at least a part of the tuning circuit means for defining the frequency of the oscillator means as a function of the degree of conductivity of the transistor; and control circuit means connected to the transistor for regulating the conductivity of the transistor so as to render the transistor conductive thereby to provide an output signal, and so as to vary the degree of conductivity of the transistor thereby to vary the frequency of the output signal.

2. A variable frequency signal generator, comprising: an oscillator for providing an output signal at the output frequency of the oscillator when operative; a biasing circuit forming a part of the oscillator for determining the operability of the oscillator; a tuning circuit forming a part of the oscillator for determining the output frequency of the oscillator when operative; a transistor having a control electrode, the transistor being connected in the biasing circuit for rendering the oscillator operative when the transistor is conductive and for rendering the oscillator inoperative when the transistor is nonconductive, the transistor further being connected in the tuning circuit for defining the output frequency of the oscillator as an inverse function of the degree of conductivity of the transistor, the conductivity of the transistor being directly related to the voltage applied to the control electrode of the transistor; and control circuit means connected to the control electrode of the transistor for applying a decreasing voltage to the control electrode of the transistor so as to initially render the transistor conductive to initiate an output signal, so as to subsequently decrease the degree of conductivity of the transistor to increase the frequency of the output signal, and so as to eventually render the transistor nonconductive to terminate the output signal.

3. A variable frequency signal generator, comprising: oscillator means for providing an output signal at the frequency of the oscillator means when operative; biasing circuit means connected within the oscillator means for determining the operability of the oscillator means; tuning circuit means connected within the oscillator means for determining the frequency of the oscillator means; a transistor including a control electrode, the transistor being connected in the biasing circuit means so as to provide a biasing circuit impedance for rendering the oscillator means operative when the biasing circuit impedance is at and below a threshold impedance and for rendering the oscillator means inoperative when the biasing circuit impedance is above the threshold impedance the transistor further being connected in the tuning circuit so as to provide a tuning circuit impedance for defining the frequency of the oscillator means as a direct function of the tuning circuit impedance, the biasing circuit impedance and the tuning circuit impedance being inversely related to the voltage applied to the control electrode of the transistor; and control circuit means connected to the base electrode of the transistor for regulating the voltage applied to the base electrode of the transistor, the control circuit means being operative to initially increase the voltage applied to the base electrode of the transistor thereby decreasing the biasing circuit impedance of the transistor below the threshold impedance to initiate an output signal, and the control circuit means being further operative to subsequently decrease the voltage applied to the base electrode of the transistor thereby gradually increasing the tuning circuit impedance of the transistor to increase the frequency of the output signal and thereby eventually increasing the biasing circuit impedance of the transistor above the threshold impedance to terminate the output signal.

4. A frequency varying signal generator, comprising: oscillator means for providing an AC output signal at the frequency of the oscillator means when turned on; biasing circuit means connected within the oscillator means so as to establish a DC bias signal on the oscillator means thereby to turn on the oscillator means when the DC bias signal is at and above a threshold voltage and to turn off the oscillator means when the DC bias signal is below the threshold voltage; tuning circuit means connected within the oscillator means for determining the frequency of the oscillator means as an inverse function of the capacitance across the tuning circuit means, the tuning circuit means including at least one tuning capacitor; a transistor including a control electrode and having a DC impedance and an AC impedance which are inverse functions of the voltage applied to the control electrode, the transistor being connected in the biasing circuit means so as to define the DC bias signal on the oscillator means as an inverse function of the DC impedance of the transistor, and connected in the tuning circuit means in series with the tuning capacitor across the tuning circuit means so as to define the capacitance across the tuning circuit means as an inverse function of the AC impedance of the transistor; and control circuit means including a control capacitor connected to the control electrode of the transistor for applying the voltage on the capacitor to the control electrode, and switching means connected to the control capacitor and having two functional states, the switching means being operative in one functional state to charge the capacitor thereby increasing the voltage on the transistor and decreasing the DC impedance of the transistor so that the DC bias signal is increased above the threshold voltage thereby to turn on the oscillator means to initiate an AC output signal, and the switching means being operative in the other functional state to discharge the capacitor thereby decreasing the voltage on the transistor and increasing the AC impedance and the DC impedance of the transistor so that the capacitance across the tuning circuit is gradually increased thereby to increase the frequency of the AC output signal, and so that the DC bias signal is eventually decreased below the threshold voltage thereby to turn off the oscillator means to terminate the AC output signal.